(12) United States Patent
Miyazaki

(10) Patent No.: US 6,303,876 B1
(45) Date of Patent: Oct. 16, 2001

(54) LSI PACKAGE STRUCTURE

(75) Inventor: Hirokazu Miyazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/570,570

(22) Filed: May 12, 2000

(30) Foreign Application Priority Data

May 13, 1999 (JP) .................................................. 11-132437

(51) Int. Cl.[7] .............................. H05K 1/16; H05K 7/02
(52) U.S. Cl. ........................ 174/260; 174/256; 174/261; 174/267; 361/760; 361/768; 257/690; 257/783
(58) Field of Search .................................. 174/260, 250, 174/261, 255, 16.3, 256, 258, 52.1, 259, 263, 267; 257/734, 738, 737, 678, 690, 712, 700, 778, 783, 698, 782, 784, 781, 786; 361/767, 768, 748, 760, 840; 29/840, 832, 592.1, 842, 843; 438/125, 106

(56) References Cited

U.S. PATENT DOCUMENTS

| | | | |
|---|---|---|---|
| 5,220,486 | * 6/1993 | Takubo et al. | 361/707 |
| 5,291,375 | * 3/1994 | Mukai | 361/760 |
| 5,471,368 | * 11/1995 | Downie et al. | 361/760 |
| 5,483,421 | * 1/1996 | Gedney et al. | 361/771 |
| 5,550,406 | * 8/1996 | McCormick | 257/666 |
| 5,574,630 | * 11/1996 | Kresge et al. | 361/792 |
| 5,586,006 | * 12/1996 | Seyama et al. | 361/719 |
| 5,717,252 | * 2/1998 | Nakashima et al. | 257/707 |
| 5,726,861 | * 3/1998 | Ostrem | 361/767 |
| 5,838,064 | * 11/1998 | Shimada et al. | 257/718 |
| 5,909,010 | * 6/1999 | Inoue | 174/260 |
| 6,052,287 | * 4/2000 | Palmer et al. | 361/767 |
| 6,084,775 | * 7/2000 | Bartley et al. | 361/705 |

FOREIGN PATENT DOCUMENTS 11-17058   1/1999   (JP) .

* cited by examiner

Primary Examiner—Jeffrey Gaffin
Assistant Examiner—I B Patel
(74) Attorney, Agent, or Firm—McGuireWoods, LLP

(57) ABSTRACT

An LSI package structure having a smaller size in which the wiring length is shortened. The wiring structure for connecting the LSI 2 with the wiring board 1 comprises first connecting terminals 3 arrayed on the LSI 2 and second connecting terminals 6 arrayed on the wiring board 1. The first connecting terminals 3 are arrayed on the outer periphery 5 of the facing surface 4 which faces the wiring board 1 and the second connecting terminals 6 are arrayed on the interfacing surface 7 which intersects with the outer periphery 5. In such a structure, the wiring board 1 is similar to the LSI 2 in size. The facing surface 4 actually intersects with the intersecting face 7 for forming a intersecting line 8. The facing surface 4 substantially intersects with the intersecting face 7 along the intersecting line 8. Such a structure makes the size of the wiring board 1 smaller than that of the LSI 2.

12 Claims, 2 Drawing Sheets

LSI PACKAGE STRUCTURE

FIELD OF THE INVENTION

The Present invention relates to a structure for packaging an LSI and in particular to an LSI packaging structure in which an LSI is integral with a wiring board.

BACKGROUND OF THE INVENTION

In a computer device, an LSI is Packaged and is implemented (or mounted) on a circuit board. The LSIs have been mounted on wiring board while they are housed in a package. The structure of such a package is generally known from Japanese Patent Kokai Publication JP 11-17058A. The known package structures are provided in the form of BGA package in which the LSIs are sealed in a mould resin so that they will not be exposed. The BGA Package is bonded on a wiring board. The BGA board has a surface area which is smaller than that of the wiring board. The BGA board to be connected in a face-up manner will be connected to the wiring board by a wire bonding technique. In such a package structure, signals are fed out from the BGA board via solder balls provided on a reverse side of the BGA board.

SUMMARY OF THE DISCLOSURE

Since wire bonding is conducted in an outward direction from the LSI in the known structure, the wires in the BGA are elongated, so that operation at higher frequencies becomes impossible. The larger BGA requires a larger mounting area, which prevents reduction in size of devices. The generated heat is dissipated to the BGA board to increase its electric resistance, which largely deteriorates the reliability of the LSI.

The LSI packages having a smaller size enabling the wiring length to be shorter have been demanded. There is much to be desired in the heat dissipation structures in which the heat is substantially directly dissipated from the LSI having a smaller size.

It is an object of the present invention to provide an LSI package structure having such a smaller size such that the wiring length is shorter.

It is another object of the present invention to provide an LSI package structure which adopts a heat dissipation structure in which heat is substantially directly dissipated from a smaller size LSI.

The technical features in the following description, which correspond to the Claims are suffixed with reference numerals, symbols, etc. with parenthesis. Although the numerals, symbols, etc. make clear the correspondence and relation between the technical features relevant to the Claims and the technical feature of one of the plural embodiments, it is to be noted that the technical features relevant to the Claims are not limited to the technical features of the embodiments.

According to an aspect of the present invention, there is provided an LSI package structure comprising connecting the LSI (2) to the wiring board (1).

The wiring structure includes first connecting terminals (3) which are arrayed on the LSI (2), and second connecting terminals which are arrayed on the wiring board.

The first connecting terminal (3) are arrayed on an outer periphery (5) of a facing surface (4) which faces the wiring board (1). The second connecting terminals (6) are arrayed on an intersecting face (7) which intersects with the outer periphery (5). In such a structure, the wiring substrate (1) is substantially similar to the LSI (2) in size so that the area of the facing surface (4) of the wiring board (1) which faces the LSI (2) is smaller than that of the bonding surface of the LSI (2).

The facing surface (4) and the intersecting face (7) intersect with each other for forming an intersecting line (8) therebetween. The facing surface (4) substantially intersects with the intersecting surface (7) along the intersecting line (8). In such a structure, the wiring board (1) is smaller than the LSI (2) in size. The first connecting terminals (3) are preferably connected to the second connected terminals (6) by means of soldering. More preferably, the first connecting terminals (3) are connected to the second connected terminals (6) with an electrically conductive adhesive.

An adhesive layer (13) is sandwiched between the wiring board (1) and the LSI (2) on the facing surface (4). In this case, the intersecting line (8) is included in the adhesive layer (13). The wiring structure further includes third connecting terminals (9) which are arrayed on the wiring board (1) on the side (surface) opposite to the side (surface) on which the wiring board faces the LSI (2). The wiring structure further includes solder balls (11) which are connected to the third connecting terminals (9). The second terminals (6) are connected to the third connecting terminals (9) via conductors (14) which are formed in the wiring board (1). Such a wiring structure enables the package to be formed more compact.

The LSI (2) is positively formed with a heat dissipating face (15) on the side opposite to the facing surface (4). Such a heat dissipation effectively improves the electric characteristics.

PREFERRED EMBODIMENTS OF THE INVENTION

Figure 1:
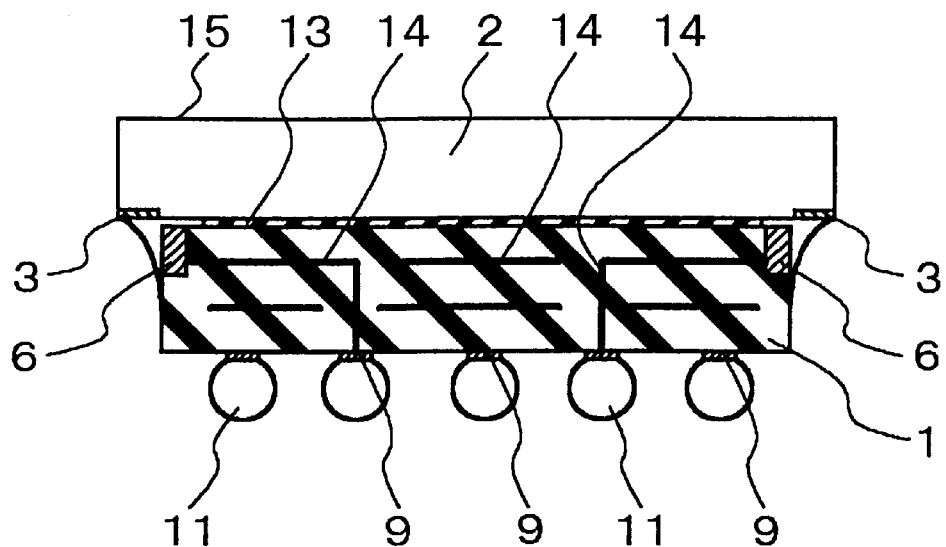
FIG. 1 A sectional view showing an embodiment of the LSI package structure of the preset invention.
Figure 2:
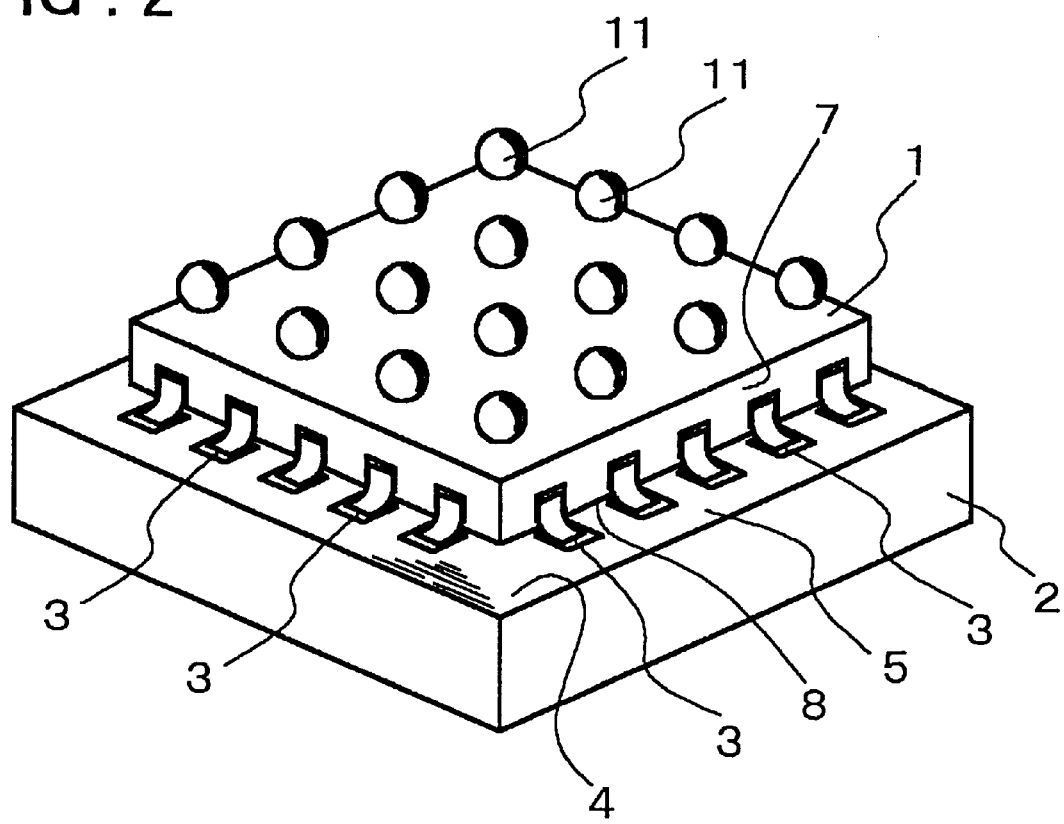
FIG. 2 A perspective projection view.

In an embodiment of the LSI package structure of the present invention, a wiring board is provided together with an LSI as shown in the drawings. The wiring board 1 is face-bonded to the LSI 2 as shown in FIG. 1. The LSI 2 is provided with first connection terminals 3. The first connection terminals 3 are arrayed at an outer closed periphery 5 which is Part of a facing surface 4 which faces the wiring board 1 as shown in FIG. 2. The bonding sides in which the wiring board 1 is face-to-face-bonded to the LSI 2 is surrounded by the outer periphery 5.

Figure 3:
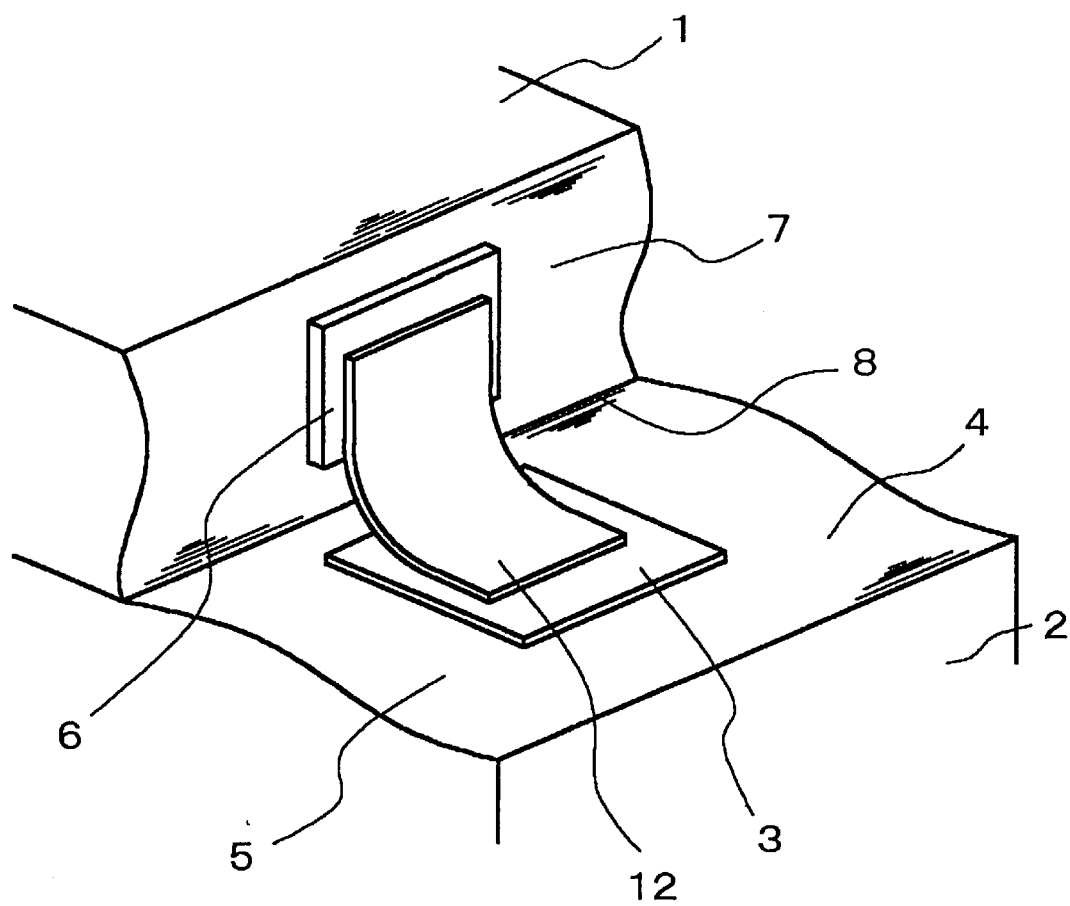
FIG. 3 A part of Perspective projection view of FIG. 2.

The wiring board 1 is provided with second connection terminals 6. The second connection terminals 6 are arrayed on an intersecting face 7 of the wiring board 1 which intersects with a plane of the outer periphery 5 as shown in FIG. 3. The facing surface 4 intersects with the intersecting face 7 along an intersecting line 8. The surfaces of the second connecting terminals 6 and the intersecting face 7 need not be coplanar. In this embodiment, the facing surface 4 intersects with the intersecting face 7 at substantially right angles. However, the intersecting angle may differ depending on the counter configuration of the wiring board and/or LSI.

The wiring structure comprising first and second connecting terminals 3 and 6 for electrically connecting the wiring board 1 with the LSI 2 further includes third connecting terminals 9. The third connecting terminals are arrayed on wiring board 1 on the side opposite to the side (surface) in which the wiring board 1 faces the LSI 2. Solder balls 11 are disposed so as to be connected to the third connecting terminals 9 corresponding thereto as shown in FIG. 2.

The first connecting terminals 3 are connected to the second connecting terminals 6 via micro-solder masses (pieces, spots or members) 12 which are used in lieu of bonding technique. It is more preferable that the first connecting terminals 3 be connected to the second connecting terminals 6 with an electrically conductive adhesive which replaces the solder masses. It is preferable that an adhesive layer 13 be sandwiched between the wiring board 1 and the LSI 2 on the facing surface 4 as shown in FIG. 1.

The second connecting terminals 6 are connected to the third connecting terminals 9 via conductors 14 which are formed in the wiring board 1.

The LSI 2 is actively formed on the side opposite to the facing surface 4 with a heat dissipating face 15. The LSI 2 is not covered on its outer sides with a resin mold in a large thickness. The package 2 including LSI 2 or LSI chip has its outer sides which serve as heat dissipating face.

Although it is not necessary to make the area of the wiring board 1 smaller than that of the LSI 2 in the above-mentioned structure, it has a feature that the area of the wiring board can be resultingly smaller than that of the LSI 2. The wiring board 1 is electrically and substantially directly connected to the LSI 2 between the one side (surface) of small size LSI 2 and one side (surface) of the smaller size wiring board 1 or an area close thereto so that the wiring area will not extend beyond the existing range of the LSI 2. Such a Package structure contributes to more reduction in size of large scale computer or hand held computer. The LSI having a shorter wiring is suitable for the operation at radio-wave frequency.

The meritorious effects of the Present invention are summarized as follows.

The whole of the LSI Package structure of the present invention has a size approximate to the outer size of the LSI. Resultingly, a package structure having an LSI and a wiring board having a size smaller than that of the LSI can be obtained, resulting in that the electric characteristics can be improved by the shortened wiring length.

The narrow pad pitch of the LSI can be widened, so that the pad pitch of the board on which the LSI is implemented or mounted can be widened. The cost of the computer can be reduced. The reverse side of the LSI can be formed as a heat dissipating face by exposing the reverse side of the LSI, so that the heat dissipation efficiency is enhanced, contributing to the enhancement in the operation efficiency and the reliability of the LSI.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An LSI package structure, comprising:

an LSI;

a wiring board; and a wiring structure for connecting said LSI to said wiring board;

said wiring structure including first connecting terminals which are arrayed on said LSI; and second connecting terminals which are arrayed on said wiring board;

said first connecting terminals being arrayed on an outer periphery of a facing surface which faces said wiring board;

said second connecting terminals being arrayed on an intersecting face which intersects with said outer periphery, said second connecting terminals on said intersecting face being electrically connected to said first connecting terminals.

2. An LSI package structure as defined in claim 1 in which said facing surface and said intersecting face intersect with each other to form an intersecting line therebetween.

3. An LSI package structure as defined in claim 2 in which said facing surface substantially intersects with said intersecting face along said intersecting line.

4. An LSI package structure as defined in claim 3 wherein said first connecting terminals are connected to said second connecting terminals through soldering.

5. An LSI package structure as defined in claim 3 wherein said first connecting terminals are connected to said second connecting terminals with an electrically conductive adhesive.

6. An LSI package structure as defined in claim 1, in which an adhesive layer is sandwiched between said wiring board and said LSI on said facing surface.

7. An LSI package structure as defined in claim 1 in which said wiring structure further comprises third connecting terminals which are arrayed on said wiring board on its side opposite to the surface on which said wiring board faces said LSI.

8. An LSI package structure as defined in claim 7 in which said wiring structure further comprises solder balls which are connected to said third connecting terminals.

9. An LSI package structure as defined in claim 8 in which said second connecting terminals are connected to said third connecting terminals via conductors which are formed in said wiring board.

10. An LSI package structure defined in claim 1, wherein said LSI is positively formed with a heat dissipating face on a side opposite to said facing surface.

11. An LSI package structure as defined in claim 1 in which said outer periphery extends to form a closed periphery turning around one pass in.

12. An LSI package structure defined in claim 1, further comprising an electrically conductive material connecting said first connecting terminals to said second connecting terminals on the intersecting face.

* * * * *